(12) United States Patent
Blecher

(10) Patent No.: US 9,614,511 B2
(45) Date of Patent: Apr. 4, 2017

(54) LOW-POWER HIGH-SWING PAM4/PAM8 FAST DRIVER

(71) Applicant: MULTIPHY LTD., Ness-Zion (IL)

(72) Inventor: Yaron Blecher, Ness-Ziona (IL)

(73) Assignee: MULTIPHY LTD., Ness-Ziona (IL)

( * ) Notice: Subject to any disclaimer, the term of this patent is extended or adjusted under 35 U.S.C. 154(b) by 0 days.

(21) Appl. No.: 15/165,905

(22) Filed: May 26, 2016

(65) Prior Publication Data

US 2016/0352315 A1 Dec. 1, 2016

Related U.S. Application Data

(60) Provisional application No. 62/166,740, filed on May 27, 2015.

(51) Int. Cl.
| | |
|---|---|
| *H03K 7/02* | (2006.01) |
| *H03K 17/60* | (2006.01) |
| *H03K 17/62* | (2006.01) |
| *H03K 17/687* | (2006.01) |
| *H03K 17/693* | (2006.01) |

(52) U.S. Cl.
CPC .............. *H03K 7/02* (2013.01); *H03K 17/60* (2013.01); *H03K 17/6242* (2013.01); *H03K 17/687* (2013.01); *H03K 17/693* (2013.01)

(58) Field of Classification Search
CPC ....................................................... H03K 7/02
See application file for complete search history.

(56) References Cited

U.S. PATENT DOCUMENTS 7,595,661 B2 * 9/2009 Kim .......................... H04L 5/16
327/108

* cited by examiner

*Primary Examiner* — Hai L Nguyen
(74) *Attorney, Agent, or Firm* — FisherBroyles, LLP; Robert Kinberg

(57) ABSTRACT

A driver for performing efficient low-power high-swing modulation, which comprises a first plurality of N controllable switching elements and introducing low impedance between the contacts in response to a low control level and vice versa; a second plurality of N controllable switching elements and introducing high impedance between the contacts in response to a low control level and vice versa; a DC power supply for feeding the driver, the positive port of which is connected to the common contact of the first plurality and the negative port of which is connected to the common contact of the second plurality; a plurality of N voltage dividers, each divider consisting of two serially connected resistors connecting between a free contact of a controllable switching element from the first plurality and a free contact of a controllable switching element from the second plurality, where each two controllable switching elements connected by a voltage divider forming a pair; a plurality of N control inputs, each of which jointly controlling the control inputs of a different pair; and a common output connecting between all N common points of all pairs of serially connected resistors forming the N voltage dividers.

8 Claims, 3 Drawing Sheets

LOW-POWER HIGH-SWING PAM4/PAM8 FAST DRIVER

CROSS-REFERENCE TO RELATED APPLICATION

This application claims the benefit of U.S. Provisional Application No. 62/166,740, filed May 27, 2015, the disclosure of which is incorporated herein by reference in its entirety.

FIELD OF THE INVENTION

The present invention relates to the field of optical communication systems. More particularly, the invention relates to an efficient fast driver for modulating data carrying sources, such as laser sources.

BACKGROUND OF THE INVENTION

Data transfer rate in modern communication systems requires a variety of Pulse Amplitude Modulation (PAM) schemes, which assigns multiple power levels to a transmitting symbol, allowing it to represent a plurality of bits. The conventional PAM-4 modulation scheme, for instance, has 4 power levels, each level representing a combination of 2 bits, similarly, a PAM-8 modulation scheme has 8 power levels, each level representing a combination of 3 bits, etc.

FIG. 1 (prior art) illustrates an example of a traditional current mode PAM-4 driver. The differential output voltage levels $O_N$ and $O_P$ are determined by the input signals, $D_1$ and $D_0$ (both $D_1$ and $D_0$ may take the logic levels "0" or "1"), which control the conductance of the switching transistors $M_0$, $M_1$, $M_2$ and $M_3$, thereby allowing one or more of the two currents $I_1$ and $I_0$, to flow (or not to flow, depending on the combination of input signals $D_1$ and $D_0$) through one or more of the resistors $R_1$ and $R_0$. As a result, different voltage levels are introduced at each output. The resulting voltage level at the negative output $O_N$, for instance, can be calculated by Eq. 1:

$$O_N = V_{DD} - [D_{1P}*I_0*R_0 + D_{0P}*I_1*R_0] \quad \text{[Eq. 1]}$$

If $I_1 = 2I_0$, the resulting output voltage is given by:

| $D_{0P}$ | $D_{1P}$ | M0 | M3 | $O_N$ |
|---|---|---|---|---|
| 0 | 0 | OFF | OFF | VDD |
| 0 | 1 | OFF | ON | VDD-$I_0$ * $R_0$ |
| 1 | 0 | OFF | OFF | VDD-$2I_0$ * $R_0$ |
| 1 | 1 | ON | OFF | VDD-$3I_0$ * $R_0$ |

However, the traditional PAM-4 driver consumes relatively high power, due to the required multi-power-level operation mode, where current flows through the resistors in 3 out of four states. The main cause for the relative high power dissipation is the use of series current sources $I_1$ and $I_0$, which require high overhead voltage that is deduced from the available voltage swing. Such overhead voltage forces the operation points of the transistors in the circuit to rise for higher output swing, and hence, requires even higher operation voltage $V_{DD}$. Another cause of this power dissipation is the inability of such PAM-4 drivers to utilize all of the $V_{DD}$ voltage range, as is apparent from Eq. 1 above.

It is therefore an object of the present invention to provide a fast driver which is power efficient for required output swing.

It is another object of the present invention to provide a fast driver which is independent of current source linearity.

It is a further object of the present invention to provide a fast driver which employs small switching transistors with low parasitics.

Other objects and advantages of the invention will become apparent as the description proceeds.

SUMMARY OF THE INVENTION

The present invention is directed to a driver for performing efficient low-power high-swing modulation, which comprises a first plurality of N controllable switching elements (such as P-type or N-type FET or bipolar transistors) having a common contact and a free contact and introducing low impedance between the contacts in response to a low control level and vice versa; a second plurality of N controllable switching elements (such as P-type or N-type FET or bipolar transistors) having a common contact and a free contact and introducing high impedance between the contacts in response to a low control level and vice versa; a DC power supply (of voltage level $V_{DD}$) for feeding the driver, the positive port of which is connected to the common contact of the first plurality and the negative port of which is connected to the common contact of the second plurality; a plurality of N voltage dividers, each of which consisting of two serially connected resistors connecting between a free contact of a controllable switching element from the first plurality and a free contact of a controllable switching element from the second plurality, where each two controllable switching elements connected by a voltage divider forming a pair; a plurality of N control inputs, each of which jointly controlling the control inputs of a different pair; and a common output connecting between all N common points of all pairs of serially connected resistors forming the N voltage dividers.

The driver may be implemented in a single ended (e.g., PAM-4 or PAM-8) arrangement or in a differential arrangement, such that the complimentary half of the driver receives the inverted version of the input signal.

The resistance of each resistor forming a voltage divider may be selected to maintain a predetermined total output resistance. The output voltage swing may range from 0 to $V_{DD}$.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

The present invention discloses a novel a fast driver for modulating data carrying sources, such as laser sources, which save DC power and efficiently exploits a given voltage swing. The proposed driver comprises a first plurality of N controllable switching elements having a common contact and a free contact and introducing low impedance between the contacts in response to a low control level and vice versa; a second plurality of N controllable switching elements having a common contact and a free contact and introducing high impedance between the contacts in response to a low control level and vice versa; a DC power supply (of voltage level $V_{DD}$) for feeding the driver, the positive port of which is connected to the common contact of the first plurality and the negative port of which is connected to the common contact of the second plurality; a plurality of N voltage dividers, each of which consisting of two serially connected resistors connecting between a free contact of a controllable switching element from the first plurality and a free contact of a controllable switching element from the second plurality, where each two controllable switching elements connected by a voltage divider forming a pair; a plurality of N control inputs, each of which jointly controlling the control inputs of a different pair; and a common output connecting between all N common points of all pairs of serially connected resistors forming the N voltage dividers.

Figure 1:
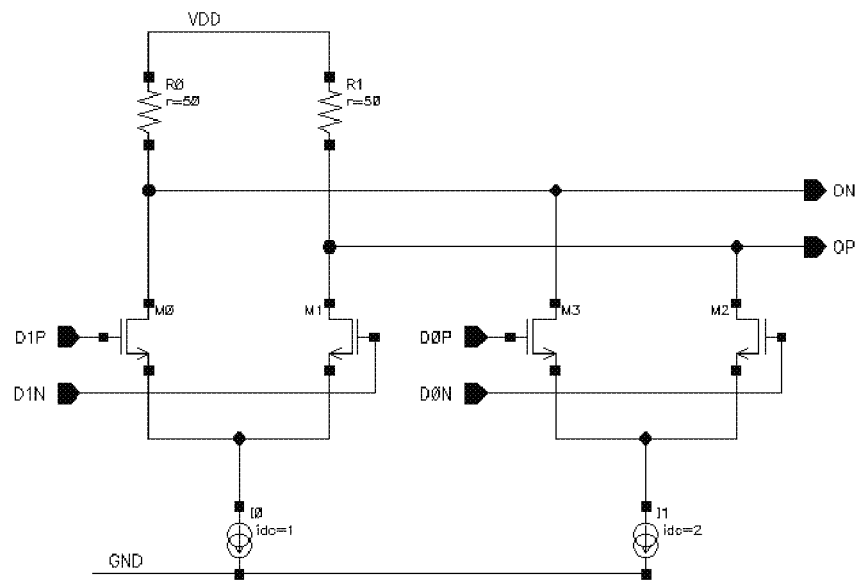
FIG. 1 (prior art) illustrates an example of a traditional current mode PAM-4 driver.
Figure 2:
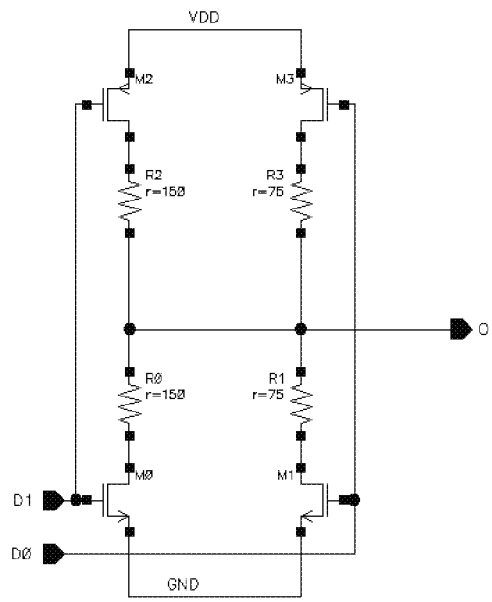
FIG. 2 shows a single ended PAM-4 driver circuit according to an embodiment of the invention.

FIG. 2 shows a single ended PAM-4 driver circuit according to an embodiment of the invention. Modulation is achieved by presenting different output voltage levels at the driver's output O, according to the binary combination value of the inputs $D_0$ and $D_1$. The driver circuit comprises of a supply voltage $V_{DD}$, two P-Channel MOSFET transistors, $M_2$ and $M_3$, (which function as controllable switches) that enter a conducting state when low voltage ("0" logic level) is applied to their gates, two N-Channel MOSFET transistors, $M_0$ and $M_1$ (controllable switches) that enter a conducting state when high voltage ("1" logic level) is applied to their gates. The drains of two pairs of MOSFET transistors are connected by two pairs of series resistors (R1, R2) and (R3, R4), while the two pairs function as a voltage divider with a common point, from which the driver's output O is taken. The two P-Channel MOSFET transistors, $M_2$ and $M_3$ are fed by the supply voltage $V_{DD}$ and the sources of the two N-Channel MOSFET transistors, $M_0$ and $M_1$ are connected to ground.

The resistors' values are determined so that in any modulation state, the driver will maintain an output resistance which will be essentially 50Ω. An additional constraint on the resistors' values is the need of a voltage divider that will allow uniform distribution of the voltage range over the different output levels.

The resulting voltage level at the output O can be calculated as a function of the inputs $D_0$ and $D_1$:

If $R_0=R_2=150Ω$ and $R_1=R_3=75Ω$, the resulting output voltage is given by:

| D0 | D1 | M0 | M1 | M2 | M3 | O |
|---|---|---|---|---|---|---|
| 0 | 0 | OFF | OFF | ON | ON | $V_{DD}$ |
| 0 | 1 | ON | OFF | OFF | ON | $V_{DD} * 2/3$ |
| 1 | 0 | OFF | ON | ON | OFF | $V_{DD} * 1/3$ |
| 1 | 1 | ON | ON | OFF | OFF | GND |

In the first state, when both input signals are in low state (logic "0"), the two N-Channel MOSFET transistors $M_0$ and $M_1$ are in cutoff mode (OFF), effectively disconnecting the output from GND. The two P-Channel MOSFETs $M_2$ and $M_3$ are in saturation mode (ON). This causes connection of the output O to the power source $V_{DD}$ with no current flowing through the resistors. The output resistance in this case is the total resistance in the parallel connection of $R_2$ and $R_3$, which is 50Ω.

In the second state, $D_0$ is in low state (logic "0"), which causes $M_1$ to be OFF (cutoff mode) and $M_3$ to be ON, while $D_1$ is in high state (logic "1") causing $M_0$ to be ON and $M_2$ to be OFF. The MOSFETs' states allow current to flow from $V_{DD}$ through $M_3$, $R_3$, $R_0$ and $M_0$ to GND. This presents the output with the voltage drop over $R_0$ which is equal to $V_{DD}*2/3$ due to the voltage divider the consists of $R_3$ and $R_0$. The output resistance in this state is the total resistance of the parallel connection of $R_3$ and $R_0$, which is 50Ω.

Similarly, in the third state $D_0$ is in high state causing $M_1$ to be ON and $M_3$ to be OFF, while $D_1$ is in low state causing $M_0$ to be OFF and $M_2$ to be ON. The MOSFETs' states cause current to flow from $V_{DD}$ through $M_2$, $R_2$, $R_1$, and $M_1$ to GND. The output voltage is the voltage drop over $R_1$ which is equal to $V_{DD}*1/3$ due to the voltage division of $R_2$ and $R_1$. The output resistance in this state is the total resistance of the parallel connection of $R_2$ and $R_1$, which is 50Ω.

In the fourth state both $D_0$ and $D_1$ are in high state (logic "1"), causing the two N-Channel MOSFETs, $M_1$ and $M_0$, to be ON and the two P-Channel MOSFETs, $M_3$ and $M_2$ to be OFF. This causes the output to be electrically connected to the GND, and the output resistance to be 50Ω.

The driver implementation illustrated in FIG. 2 does not require any current sources, causing high efficiency and low power consumption for the same output swing. Also, the proposed driver has low common mode noise, since it does not depend on current sources linearity.

The whole power supply voltage range is utilized for output levels, thereby improving efficiency and allowing uniform distribution of the output voltage levels over the overall voltage range $V_{DD}$. Also, two (out of 4) states consume no static DC current (with no load). In the proposed implementation, the switching transistors can be small since Vbs=0 which leads to less capacitance, higher speed and less dynamic power consumption. The driver even saves power when used as single ended driver.

Figure 3:
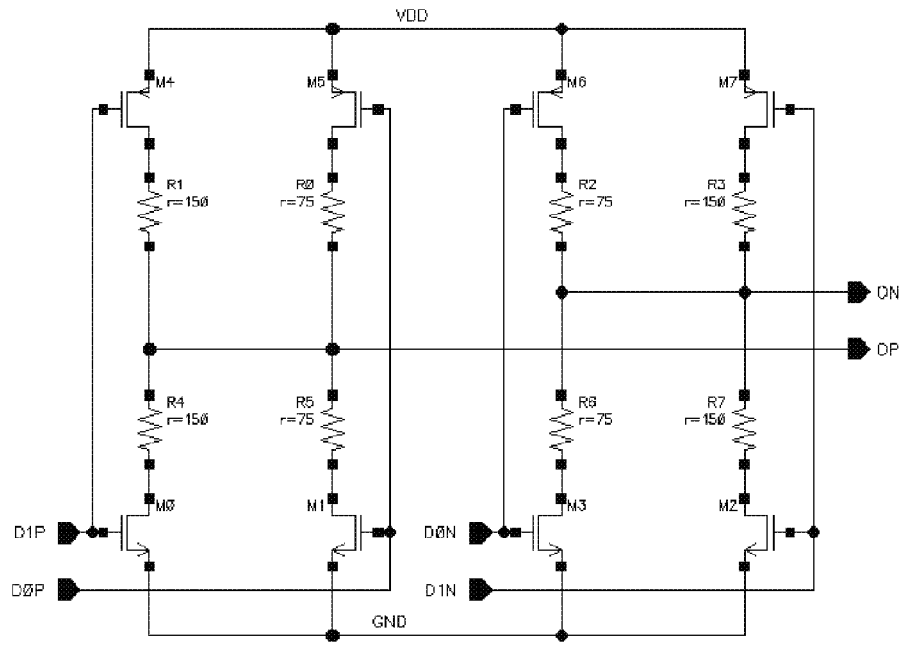
FIG. 3 shows a differential version of the PAM-4 driver of FIG. 2, according to an embodiment of the invention.

FIG. 3 shows a differential version of the PAM-4 driver of FIG. 2, according to an embodiment of the invention. The differential driver is divided to two independent single ended sides. Each side of the driver receives either the positive or the negative reflection of the input signals $D_0$ and $D_1$. Each side produces an output that corresponds to its inputs, i.e. $O_N$ refers to $D_{1_N}$ and to $D_{0_N}$ while $O_P$ refers to $D_{1_P}$ and to $D_{0_P}$. Each of the output resistances is kept 50Ω.

Figure 4:
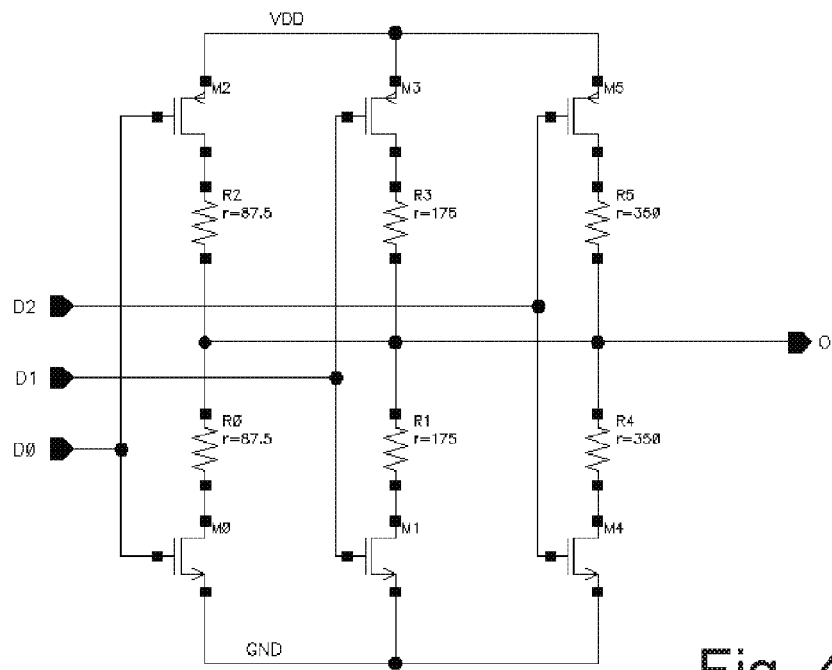
FIG. 4 shows a single ended version of a PAM-8 driver, according to an embodiment of the invention.

FIG. 4 shows a single ended version of a PAM-8 driver, according to an embodiment of the invention. Similar to the single ended PAM-4 driver of FIG. 2, the conductivity (ON/OFF) of the MOSFETs in the PAM-8 is controlled by the values of the input signal ($D_0$, $D_1$ and $D_2$). The input signals force different combinations of conductivity allowing, once again, uniform distribution of the output voltage levels over the overall voltage range.

In the example of the fifth state, for the sake of demonstrating, $D_0=1$, $D_1=0$, $D_2=1$. In this example $M_0$, $M_3$ and $M_4$ will be on, while $M_1$, $M_2$ and $M_5$ will be off. This will allow current to flow from $V_{DD}$ through $M_3$ and $R_3$, split between $R_0$ and $R_4$, and finally end up at GND. The output voltage in this case would be the voltage drop across the total resistance of the parallel connection of $R_4$ and $R_0$. The total resistance value is $$R_T = \frac{350 * 87.5}{350 + 87.5} = 70\Omega,$$

and the output voltage value is $$O = V_{DD} * \frac{R_T}{R_T + R_3} = V_{DD} * \frac{70}{70 + 175} = V_{DD} * \frac{2}{7},$$

similar to the PAM-4 implementation (of FIG. 2). The output resistance in this example is $R_3 \| R_T$ which is equal to $$175 \| 70 = \frac{175 * 70}{175 + 70} = 50\Omega.$$

The output resistance in this circuit is kept 50Ω in all states due to the values of and the connection between resistors $R_0$ to $R_5$. By adding another pair of switches and adjusting the resistors values, the design can support PAM8 while keeping the advantages of PAM4 implementation, illustrated in FIG. 2.

Figure 5:
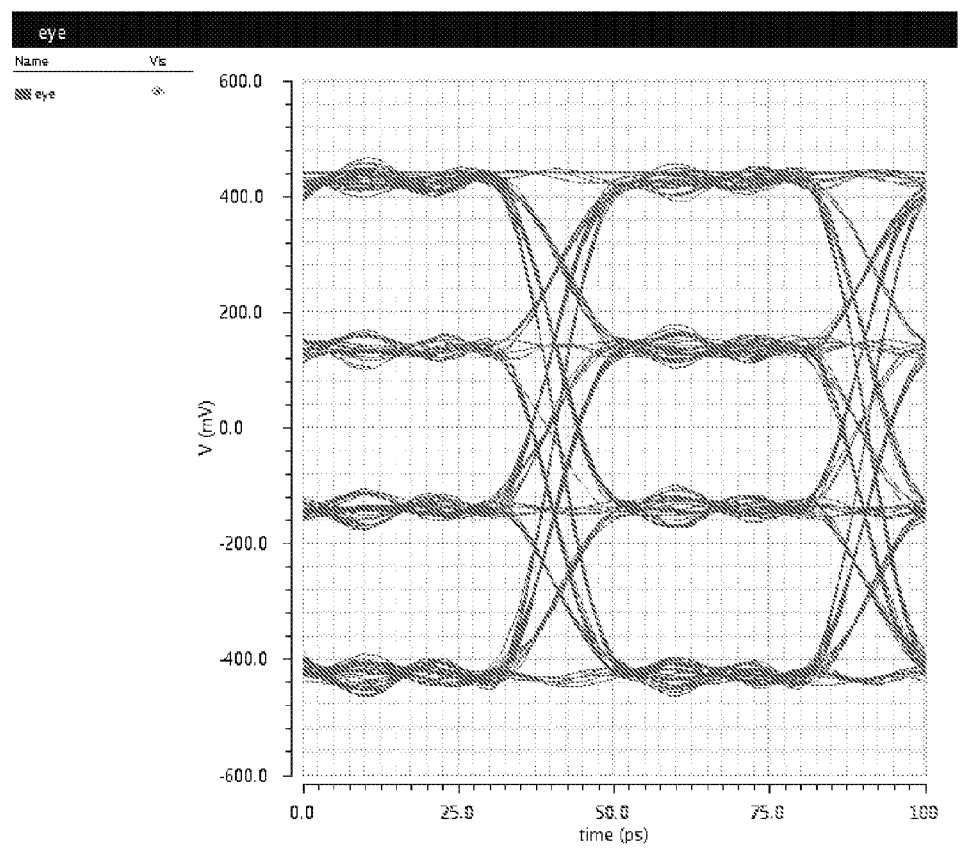
FIG. 5 shows eye diagram simulation results using the single ended PAM-4 driver of FIG. 2.

FIG. 5 shows eye diagram simulation results using the single ended PAM-4 driver of FIG. 2, with estimated layout parasitic, package model and 20 GHz output signal.

The above examples and description have of course been provided only for the purpose of illustration, and are not intended to limit the invention in any way. As will be appreciated by the skilled person, the invention can be carried out in a great variety of ways, employing more than one technique from those described above, other than used in the description, all without exceeding the scope of the invention.

The invention claimed is:

1. A driver for performing efficient low-power high-swing modulation, comprising:
   a) a first plurality of N controllable switching elements having a common contact and a free contact and introducing low impedance between said contacts in response to a low control level and vice versa;
   b) a second plurality of N controllable switching elements having a common contact and a free contact and introducing high impedance between said contacts in response to a low control level and vice versa;
   c) a DC power supply ($V_{DD}$) for feeding said driver, the positive port of which is connected to the common contact of said first plurality and the negative port of which is connected to the common contact of said second plurality;
   d) a plurality of N voltage dividers, each of which consisting of two serially connected resistors connecting between a free contact of a controllable switching element from said first plurality and a free contact of a controllable switching element from said second plurality, where each two controllable switching elements connected by a voltage divider forming a pair;
   e) a plurality of N control inputs, each of which jointly controlling the control inputs of a different pair; and
   f) a common output connecting between all N common points of all pairs of serially connected resistors forming said N voltage dividers.

2. A driver according to claim 1, being implemented in a differential arrangement, such that the complimentary half of the driver receives the inverted version of the input signal.

3. A driver according to claim 1, being implemented as a single ended arrangement.

4. A driver according to claim 1, being implemented as a single ended PAM-4 modulation scheme, where N=2.

5. A driver according to claim 1, being implemented as a single ended PAM-8 modulation scheme, where N=3.

6. A driver according to claim 1, in which the resistance of each resistor forming a voltage divider is selected to maintain a predetermined total output resistance.

7. A driver according to claim 1, in which the output voltage swing ranges from 0 to $V_{DD}$.

8. A driver according to claim 1, in which the controllable switching elements belong to a combination of P-type and N-type FET or bipolar transistors.

* * * * *